United States Patent [19]
Nakamura et al.

[11] Patent Number: 5,699,264
[45] Date of Patent: Dec. 16, 1997

[54] SEMICONDUCTOR CIRCUIT DESIGN VERIFYING APPARATUS

[75] Inventors: Yoshiki Nakamura; Hirofumi Yamamoto, both of Hyogo; Terutoshi Yamasaki, Tokyo, all of Japan

[73] Assignees: Mitsubishi Electric Semiconductor Software Co., Ltd., Hyogo; Mitsubishi Denki Kabushiki Kaisha, Tokyo, both of Japan

[21] Appl. No.: 633,315

[22] Filed: Apr. 17, 1996

[30] Foreign Application Priority Data

Dec. 12, 1995 [JP] Japan ................................. 7-323065

[51] Int. Cl.⁶ ....................................................... G06F 17/50
[52] U.S. Cl. ........................................................... 364/489
[58] Field of Search ................................. 364/488, 489, 364/490, 491, 578

[56] References Cited

U.S. PATENT DOCUMENTS

| | | | |
|---|---|---|---|
| 5,446,674 | 8/1995 | Ikeda et al. | 364/489 |
| 5,463,563 | 10/1995 | Bair et al. | 364/490 |
| 5,469,366 | 11/1995 | Yang et al. | 364/489 |
| 5,471,409 | 11/1995 | Tani | 364/578 |
| 5,541,849 | 7/1996 | Rostoker et al. | 364/489 |
| 5,568,395 | 10/1996 | Huang | 364/489 |
| 5,623,418 | 4/1997 | Rostoker et al. | 364/489 |

*Primary Examiner*—Kevin J. Teska
*Assistant Examiner*—Leigh Marie Garbowski
*Attorney, Agent, or Firm*—Leydig, Voit & Mayer, Ltd.

[57] ABSTRACT

In a semiconductor circuit design verifying apparatus, a parasitic device retrieving part retrieves a parasitic device for a signal line connecting first stage active devices to a next stage active device. A time constant computing device computes a time constant between each first stage active device and the next stage active device including the parasitic device for the signal line between the first stage active devices and the next stage active device. An output data generating device outputs the time constant and information associated with the time constant to a user.

11 Claims, 10 Drawing Sheets

FIG. 3

| | NODE NAME | LOGIC | DELAY TIME |
|---|---|---|---|
| 1 | D1XX1 | L | 10.07E-9 |
| 2 | D6XX4 | H | 9.01E-9 |
| 3 | D8XX5 | H | 9.00E-9 |
| 4 | D10X3 | L | 8.97E-9 |

25 — NODE NAME
26 — LOGIC
27 — DELAY TIME

SEMICONDUCTOR CIRCUIT DESIGN VERIFYING APPARATUS

BACKGROUND OF THE INVENTION

1. Field of the Invention

This invention relates to a semiconductor circuit design verifying apparatus for verifying the appropriateness of a designed semiconductor circuit such as an LSI (large-scale integrated circuit) when the circuit is designed.

2. Description of the Prior Art

FIG. 16 is a block diagram showing a conventional semiconductor circuit design verifying apparatus. In the figure, reference numeral 101 denotes the logic circuit drawing information describing the logic circuits of an LSI to be designed. Reference numeral 102 denotes the layout-plotted drawing information describing the plotted layout of an LSI chip to be designed. Reference numeral 103 denotes a critical-part selecting part for a user's selection of a part to be considered to be critical in operation for the user from the logic circuit drawing information 101 and the layout-plotted drawing information 102, and the critical-part selecting part 103 outputs the selected part. Reference numeral 104 denotes an input data generating part for circuit simulation; the input data generating part 104 is to generate data necessary for executing the circuit simulation of the critical part selected by the critical-part selecting part 103. Reference numeral 105 denotes an input data holding part for circuit simulation; the input data holding part 105 holds data generated by the input data generating part 104. Reference numeral 106 denotes a circuit simulation executing part executing the circuit simulation of the critical part selected by the critical-part selecting part 103 on the data held in the input data holding part 105. Reference numeral 107 denotes a simulation results holding part for storing the results of the execution of the circuit simulation executing part 106. Reference numeral 108 denotes a simulation results displaying part displaying the simulation results held by the simulation results holding part 107.

Next the operation thereof will be described.

At first, a designer of an LSI inputs the logic circuit drawing information 101 and the layout-plotted drawing information 102 of the designed LSI into the semiconductor circuit design verifying apparatus, and selects a part considered to be critical in the logic circuit by means of the critical-part selecting part 103 after examining the circuit. Here, the "critical part" means such a part that the whole designed circuit does not operate at some condition of the part or that the operation of the circuit is in a state inferior to a prescribed standard value even if it operates. Namely, the critical part means a part whose operation seriously influences the operation of the whole designed circuit. The input data generating part 104 generates input data for the circuit simulation of the critical part selected from the designed circuit to store the data in the input data holding part 105. The circuit simulation executing part 106 takes in the data for circuit simulation which are held in the input data holding part 105 to execute circuit simulation. The results of the simulation are stored in the simulation results holding part 107. Besides, the results are sent to the simulation results displaying part 108 for operator's judgment as to the appropriateness of the operation of the designed circuit. That is to say, the operator judges whether the circuit operates properly or not from the viewpoint of the output load of the transistors (fan out) in a circuit to which the simulation was executed by watching the results of the simulation displayed on the simulation results displaying part 108.

Since the conventional semiconductor circuit design verifying apparatus is organized as above, it executes the verification of the relationship between the driving ability and the output signal lines of a transistor as to the size, wiring capacitance (including parasitic capacitance) and wiring resistance (including parasitic resistance) of the transistor. That is to say, since dynamic operation corresponding to time series is needed for executing circuit simulation, there is required the execution of circuit simulation for every combination of the sizes, the wiring capacitance (including parasitic capacitance) and the wiring resistance (including parasitic resistance) of a great number of transistors in the whole circuit or the wide range of circuits. Consequently, the conventional apparatus has a problem that it takes a great deal of time for the verification of the fan out thereof, and then, that the circuit simulation is practically done for a part of the circuit which is selected by a designer and it is difficult to execute the simulation of the whole circuit.

SUMMARY OF THE INVENTION

In view of the foregoing, it is an object of the present invention to provide a semiconductor circuit design verifying apparatus capable of verifying the fan out of the whole designed circuit or the comparatively wide range part thereof at high speed.

It is another object of the present invention to provide a semiconductor circuit design verifying apparatus capable of suppressing the amount of computation required for the verification of a designed circuit to be small, and thereby capable of verifying the whole of a large scale designed circuit for a short time.

It is a further object of the present invention to provide a semiconductor circuit design verifying apparatus capable of decreasing the amount of the computation of time constants, and thereby capable of shortening the time of the verification of a designed circuit furthermore.

It is a further object of the present invention to provide a semiconductor circuit design verifying apparatus from which the restricted information of time constants necessary for the verification of design is outputted, and thereby the apparatus can verify the design at high speed.

It is a further object of the present invention to provide a semiconductor circuit design verifying apparatus capable of executing the verification of design more accurately with the consideration of active devices.

It is a further object of the present invention to provide a semiconductor circuit design verifying apparatus in which a user can specify a part in a designed circuit that is necessary to be verified, and the computing time of which can furthermore be shortened by executing the verification of the design of the specified part.

It is a further object of the present invention to provide a semiconductor circuit design verifying apparatus capable of automatically specifying a part whose design is necessary to be verified and capable of executing the verification of the design rapidly.

It is a further object of the present invention to provide a semiconductor circuit design verifying apparatus capable of verifying a designed circuit by executing the static analysis of the circuit even if it has bus lines, and thereby capable of decreasing the amount of computation for the verification of the designed circuit, and finally capable of verifying the design of the circuit including bus lines in a short time.

It is a further object of the present invention to provide a semiconductor circuit design verifying apparatus in which important information is preferentially outputted at the time of the verification of design, and thereby which can specify a wrongly designed part rapidly.

It is a further object of the present invention to provide a semiconductor circuit design verifying apparatus whose results of verification can more clearly be grasped on a logical circuit drawing.

It is a further object of the present invention to provide a semiconductor circuit design verifying apparatus whose results of verification can more clearly be grasped on a layout-plotted drawing.

According to the first aspect of the present invention, for achieving the above-mentioned objects, there is provided a semiconductor circuit design verifying apparatus comprising a parasitic device retrieving means for retrieving a parasitic device parasitic on a signal line connecting a plurality of active devices composing a semiconductor circuit from inputted design information, a time constant computing means for computing a time constant between each active device and a next step active device among the plurality of active devices included in the design information inclusively of the parasitic device parasitic on the signal line connecting the active devices and retrieved by the parasitic device retrieving means, and a time constant information outputting means for outputting the information concerned with the time constant computed by the time constant computing means in connection with at least a part of the design information of the semiconductor circuit.

According to the second aspect of the present invention, there is provided a semiconductor circuit design verifying apparatus whose time constant computing means computes a time constant by replacing the resistance components and the capacitance components of each active device and the next step active device and a parasitic device with a combination of one synthesized resistance and one synthesized capacitance.

According to the third aspect of the present invention, there is provided a semiconductor circuit design verifying apparatus which further comprises a comparing means for comparing a time constant computed by the time constant computing means and the value of a prescribed reference time constant stored in a storing means, and wherein the time constant information outputting means outputs the information concerning the time constant having a value larger than the reference time constant on the result of the comparison by the comparing means.

According to the fourth aspect of the present invention, there is provided a semiconductor circuit design verifying apparatus wherein the design information includes the active device operation state information indicating an operation state of an active device, and the time constant computing means selects a computation formula fitting to the operation state of the active device from a plurality of computing formulae on the active device operation state information to compute a time constant in conformity with the selected computation formula.

According to the fifth aspect of the present invention, there is provided a semiconductor circuit design verifying apparatus whose time constant computing means computes the time constant of a path including a signal line selected by a user out of the inputted design information of a semiconductor circuit, and sends the computed time constant to the time constant information outputting means.

According to the sixth aspect of the present invention, there is provided a semiconductor circuit design verifying apparatus whose time constant computing means executes the computation of a time constant of the part where the design of a semiconductor circuit was changed if the inputted design information of the semiconductor circuit was updated owing to the change of design.

According to the seventh aspect of the present invention, there is provided a semiconductor circuit design verifying apparatus whose time constant computing means divides a semiconductor circuit into a region up to a bus line and a region after the bus line to execute the computation of a time constant in each region independently if the semiconductor circuit includes the bus line.

According to the eighth aspect of the present invention, there is provided a semiconductor circuit design verifying apparatus whose time constant information outputting means outputs the information concerned with time constants computed by the time constant computing means in order of largeness of the values of the time constants.

According to the ninth aspect of the present invention, there is provided a semiconductor circuit design verifying apparatus whose time constant information outputting means outputs the information concerned with a time constant computed by the time constant computing means with correspondence to a signal line in a logic circuit diagram of a semiconductor circuit.

According to the tenth aspect of the present invention, there is provided a semiconductor circuit design verifying apparatus whose time constant information outputting means outputs the information concerned with a time constant computed by the time constant computing means with correspondence to a signal line in a layout-plotted drawing of a semiconductor circuit.

BRIEF DESCRIPTION OF THE DRAWINGS

Further objects and advantages of the present invention can be more fully understood from the following detailed description taken in conjunction with the accompanying drawings, in which:

FIG. 3 is a view showing a picture displayed on the displaying part in the case where a list of the information of time constants is outputted as an example of a result outputted from the output data generating part of the embodiment 1;

DETAILED DESCRIPTION OF THE PREFERRED EMBODIMENTS

Preferred embodiments of the present invention will now be described in detail with reference to the accompanying drawings.

FIRST EMBODIMENT

Figure 1:
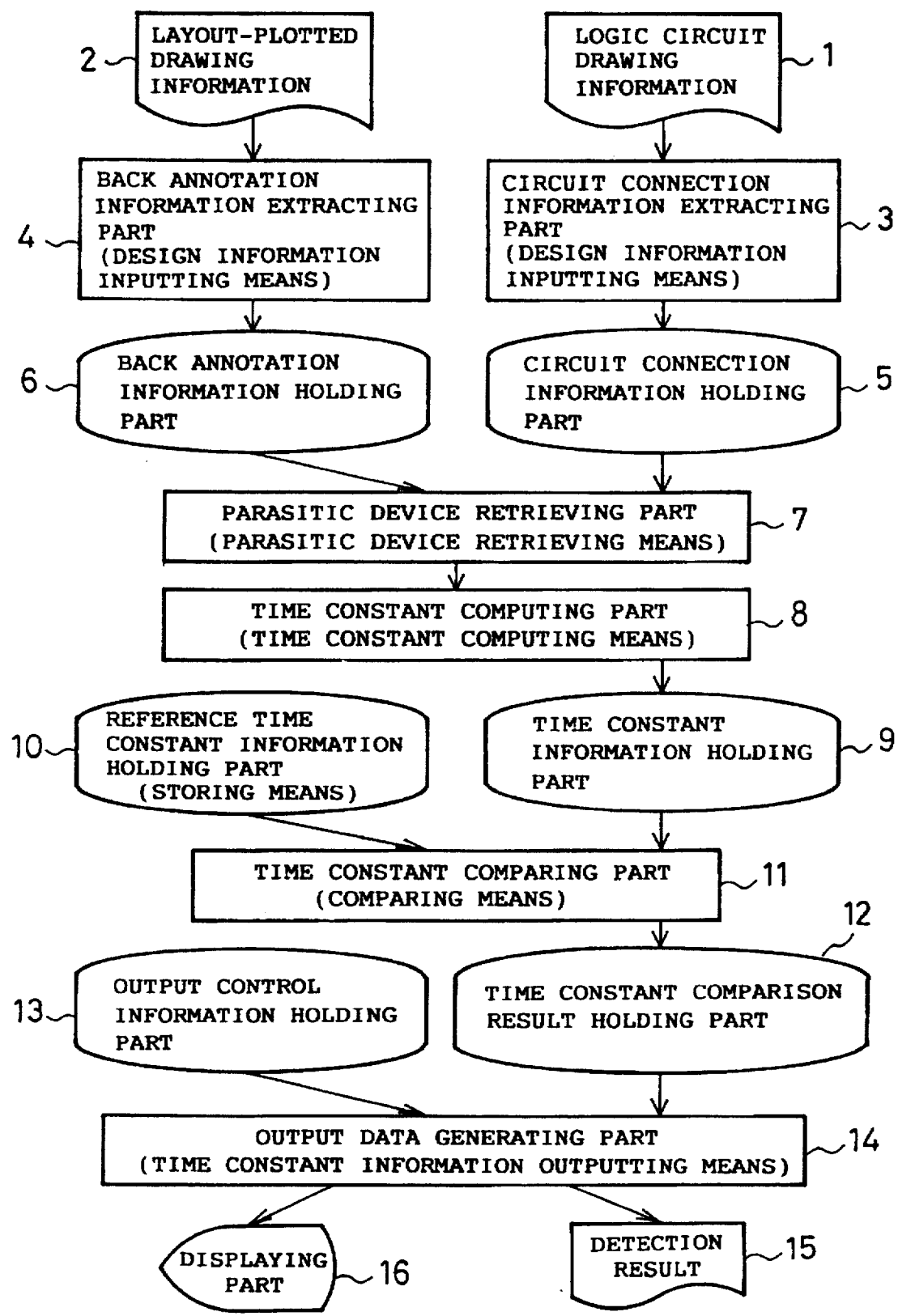
FIG. 1 is a block diagram showing the structure of the semiconductor circuit design verifying apparatus of a first embodiment (embodiment 1) of the present invention.

FIG. 1 is a block diagram showing the structure of the semiconductor circuit design verifying apparatus of the first embodiment. In the figure, reference numeral 1 denotes the logic circuit drawing information of a designed circuit. Reference numeral 2 denotes the layout-plotted drawing information of the designed circuit. The logic circuit drawing information 1 and the layout-plotted drawing information 2 are consistent with each other. Reference numeral 3 denotes a circuit connection information extracting part (design information inputting means) extracting circuit connection information from the logic circuit drawing information 1 to hold it. Reference numeral 4 denotes a back annotation information extracting part (design information inputting means) extracting the information e.g. concerned with a parasitic device being a resistance component and a capacitance component to be generated on respective signal lines from the layout-plotted drawing information 2. Reference numeral 5 denotes a circuit connection information holding part holding the circuit connection information extracted by the circuit connection information extracting part 3. Reference numeral 6 denotes a back annotation information holding part holding the back annotation information extracted by the back annotation information extracting part 4. Reference numeral 7 denotes a parasitic device retrieving part (parasitic device retrieving means) retrieving a parasitic device on each signal line in the circuit from the circuit connection information and the back annotation information to output the retrieved device. Reference numeral 8 denotes a time constant computing part (time constant computing means) computing the time constant of an output signal line of the transistors comprising CMOS logic gates or of a simple transistor (active device) in the designed circuit inclusively of a parasitic device parasitic on the signal line to output the computed time constant. Reference numeral 9 denotes a time constant information holding part holding the time constant computed by the time constant computing part 8 together with the connection information of the circuit. Reference numeral 10 denotes a reference time constant information holding part (storing means) storing the information indicating the reference time constant set by a user. Reference numeral 11 denotes a time constant comparing part (comparing means) comparing the time constant computed by the time constant computing part 8 with the reference time constant stored in the reference time constant information holding part 10 to output only the information of the time constant superior to the reference time constant. Reference numeral 12 denotes a time constant comparison result holding part holding the information of the time constant outputted from the time constant comparing part 11. Reference numeral 13 denotes an output control information holding part holding the information concerned with the format of outputting a verified result. Reference numeral 14 denotes an output data generating part (time constant information outputting means) generating the information of the time constant held in the time constant comparison result holding part 12 in a format according to the output control information held in the output control information holding part 13 to output as a detection result 14; the output data generating part 15 also makes the displaying part 16 display the result of verification.

Next, the operation thereof will be described.

Figure 2:
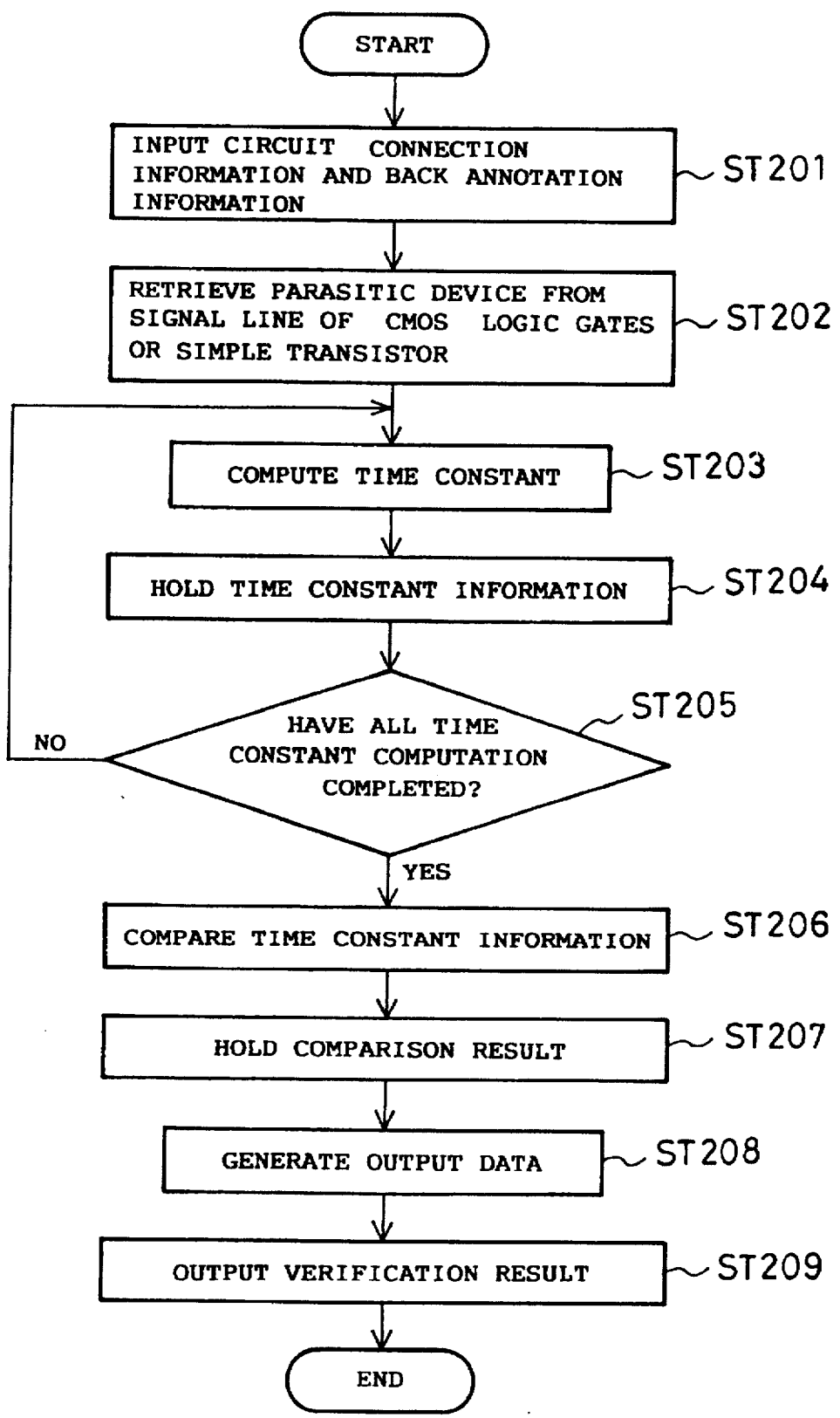
FIG. 2 is a flow chart showing the operation of the semiconductor circuit design verifying apparatus of the embodiment 1.

FIG. 2 is a flow chart showing the operation of the semiconductor circuit design verifying apparatus organized as above. At first, the general operation of the semiconductor circuit design information verifying apparatus described above will be described. The circuit connection information and the back annotation information are respectively extracted by the circuit connection information extracting part 3 and the back annotation information extracting part 4 from the logic circuit drawing information 1 of a circuit to be verified and the layout-plotted drawing information 2 having consistency with the logic circuit drawing information 1; the extracted information is stored in the circuit connection information holding part 5 and the back annotation information holding part 6 respectively (STEP ST201).

Next, a parasitic device which is added to the output signal line of each CMOS logic gate, is retrieved by the parasitic device retrieving part 7 for the circuit connection information and the back annotation information to output the retrieved parasitic device information together with the connection information of a designed circuit (STEP ST202). The retrieval of the parasitic device in this case is executed until the area searched for the retrieval reaches the input terminal of the next step logic gate or the gate terminal of the next step transistor. When the area searched for the retrieval reaches the input terminal of the next step CMOS logic gate or the gate terminal of the next step transistor, the gate capacitance of the input terminal or the gate terminal is computed to be added to the parasitic device.

The gate capacitance CG of the input terminal of the CMOS logic gate or the gate terminal of the transistor is obtained in conformity with the following formula (1).

$$CG = L \cdot W \cdot Cox \qquad (1)$$

where L denotes the channel length of the transistor, W denotes the channel width of the transistor, and Cox denotes the gate capacitance per a unit area.

Next, as to the CMOS logic gate or the transistor in the CMOS logic circuit to be verified, the time constant between the gate thereof and the next step gate or transistor is computed at every path by the time constant computing part 8 (STEP ST203). The detailed operation of the computation of a time constant at every path will later be described in detail. The obtained time constant is reserved in the time constant information holding part 9 together with the circuit connection information (STEP ST204). Next, whether the computation of the time constant is completed or not is judged as to all the CMOS logic gates that are the object of the verification (STEP ST205). If the computation of the time constant is not finished as to all the CMOS logic gates or the transistors, one of the CMOS logic gates or the transistors is selected out of the residual CMOS logic gates or the transistors. And, the system returns to the STEP ST203 to execute the computation of the time constant concerned with the CMOS logic gate or the transistor. If the computation of the time constant between all the CMOS logic gates or the transistors that have a next step device and the next step device is finished at the STEP ST205, the values of all the time constants in the time constant information held in the time constant information holding part 9 at the STEP ST204 and the value of the reference time constant stored in the reference time constant information holding part 10 are compared (STEP ST206). Only the time constant information corresponding to the values of the time constants larger than the value of the reference time constant is retrieved from the time constant information holding part 9 by the time constant comparing part 11 to be stored into the time constant comparison result holding part 12 (STEP ST207). Next, an output data is generated in the output data generating part 14 in conformity with the output format held in the output control information holding part 13 on the basis of the time constant information held in the time constant comparison result holding part 12 (STEP ST208). The generated output data is outputted as a verification result 15 in conformity with the output format (STEP ST209). The generated data is also displayed by the displaying part 16.

FIG. 3 is a view showing a picture displayed by the displaying part 16 in the case where a list of the time constant information is outputted as the example of an output result of the output data generating part 14. In the figure, reference numeral 25 denotes a signal line name displaying region. Reference numeral 26 denotes a signal line logic displaying region. Reference numeral 27 denotes a time constant displaying region. In this example, the following items are displayed, namely, output signal line names, the information indicating the polarities of transistors (the information concerned with whether a transistor on a path whose time constant is computed is an N-channel transistor or a P-channel transistor), and time constants. That is, the signal line names are displayed in the signal line name displaying region 25 in the figure; the information indicating the polarities of transistors corresponding to respective signal lines is displayed in the signal line logic displaying region 26; time constants corresponding to respective signal lines are displayed in the time constant displaying region 27. As to the polarity of a transistor displayed on the signal line logic displaying region 26, "L" is displayed when a time constant is computed by means of N-channel ON-resistance, and "H" is displayed when a time constant is computed by means of P-channel ON-resistance.

The output data generating part 14 has a sorting function for sorting time constant information; the information of time constants is sorted in order of largeness of the values of the time constants to be outputted by means of the sorting function. Since the information is displayed in order of importance for the verification of a design by sorting as above, the verification can rapidly be executed.

Next, the processing of the computation of a time constant between respective paths in a CMOS logic gate and the next step device in the STEP ST203 described above will be described. At first, the ON-resistance of a transistor composing the CMOS logic gate is computed as the preliminary processing of the computation of the time constant. The description will illustrate the case where the transistors defining the logic gate are connected in parallel to each other and the case where the transistors defining the logic gate are connected in series to each other, respectively.

Figure 4:
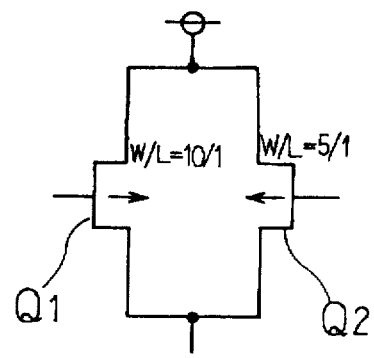
FIG. 4 is a diagram showing the part where transistors in a designed circuit are connected in parallel.
Figure 5:
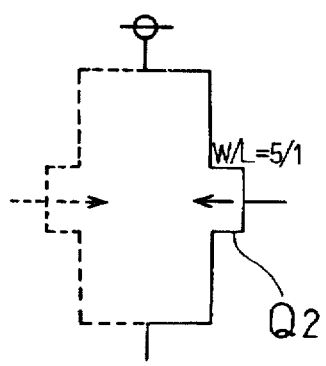
FIG. 5 is a diagram for illustrating the computation of a time constant of the part where the transistors in the designed circuit are connected in parallel.

FIG. 4 and FIG. 5 are diagrams for illustrating the computation in the case where the transistors are connected in parallel. FIG. 4 shows a state before the processing of the computation; FIG. 5 shows a state after the processing of the computation. In the case where the transistors (active devices) Q1, Q2 are connected in parallel, the ON-resistance is computed to respective transistors connected in parallel. That is to say, in the case where the transistors Q1 and Q2 are connected in parallel as shown in FIG. 4, the ON-resistance of the transistors Q1 and Q2 is separately computed as shown in FIG. 5. The case where the transistors connected in parallel turn on at the same time is not considered here, because the synthesized resistance becomes low in that case and the time constant between the transistors and the next step device becomes smaller than that in the case where only one transistor turns on if the other conditions are equal.

For obtaining the ON-resistance of the transistors, drain current Ids is obtained first in conformity with the following formulae (2) through (4).

$$Ids = (\beta/2) \times (Vgs - Vth)^2 \quad (2)$$

$$\beta = W/L \times \mu \times Cox \quad (3)$$

$$Cox = \epsilon_{ox} \times \epsilon_0 / Tox \quad (4)$$

where $\beta$ denotes the gain constant of a transistor; Vgs denotes the voltage between the gate and the source of the transistor; Vth denotes the threshold voltage of the transistor; W denotes the channel width of the transistor; L denotes the channel length of the transistor; Tox denotes the thickness of the gate oxide film of the transistor; μ denotes the moving speed of a carrier; Cox denotes the gate capacitance per unit area; $\epsilon_{ox}$ denotes the relative permittivity of the oxide film; and $\epsilon_0$ denotes the permittivity of the vacuum. These values concerned with a transistor are included in the circuit connection information extracted from the logic circuit drawing information.

If the drain current Ids is obtained, the ON-resistance $R_{on}$ is obtained by means of the Ohm's law in conformity with the following formula (5).

$$R_{ON} = V_{DD}/Ids \quad (5)$$

where $V_{DD}$ denotes the voltage of the power supply.

Figure 6:
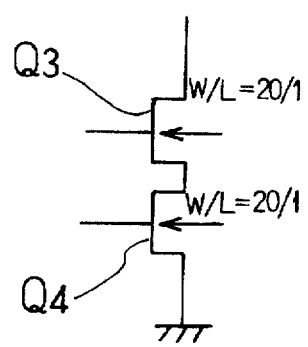
FIG. 6 is a diagram showing the part where transistors in a designed circuit are connected in series.
Figure 7:
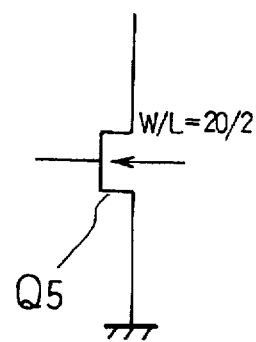
FIG. 7 is a diagram for illustrating the computation of a time constant of the part where transistors in a designed circuit are connected in series.

FIG. 6 and FIG. 7 are diagrams for illustrating the processing in the case where transistors are connected in series. FIG. 6 is a diagram showing the state of the connection of the transistors before the processing of the computation. FIG. 7 shows the connection information of the transistors after the processing of the computation. That is to say, in the case where transistors (active devices) Q3 and Q4 are connected in series, the ON-resistance is computed as if the channels of respective transistors are connected in series to form one transistor. Namely, if the transistors Q3 and Q4 are connected in series as shown in FIG. 6, the ON-resistance is computed by applying the above-mentioned formulae (2) through (5) to an imaginarily designed transistor (active device) Q5 having a channel composed of the channels of the respective transistors connected in series as shown in FIG. 7.

Figure 8:
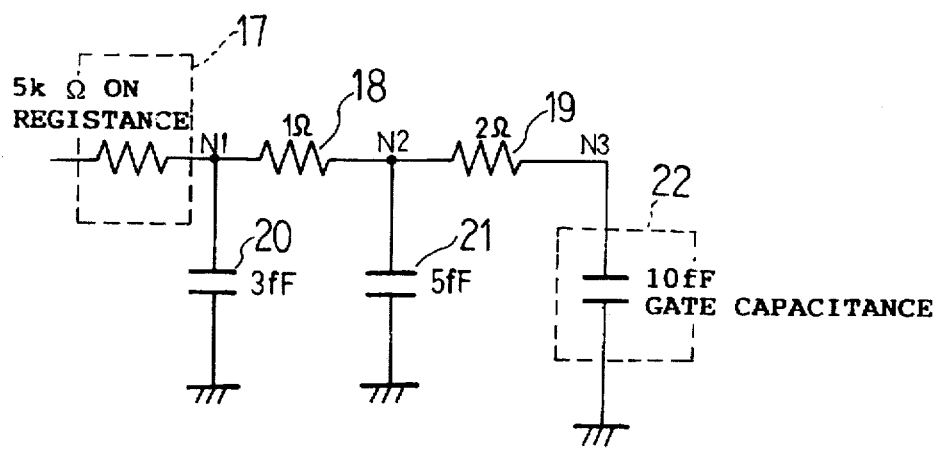
FIG. 8 is a diagram showing the information visually representing parasitic devices on output signal lines and the gate capacitance of a next step transistor.
Figure 9:
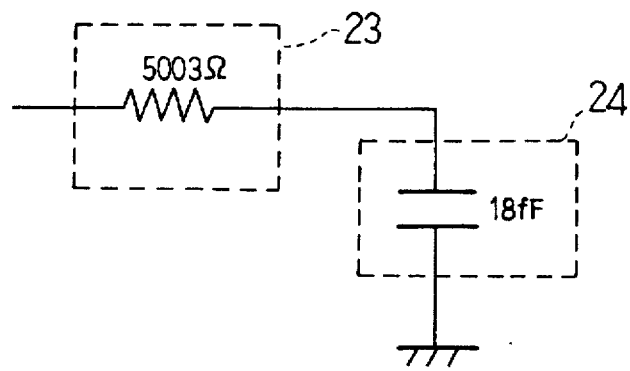
FIG. 9 is a diagram showing the equivalent circuit of the circuit shown in FIG. 8.

Next, the computation of a time constant will be described. FIG. 8 is a diagram showing the visually represented transistor information, circuit connection information, the parasitic device information on output signal lines and the gate capacitance information of the next step transistor for computing the time constant. In the figure, reference numeral 17 denotes the ON-resistance of a transistor. Reference numerals 18 and 19 denote parasitic resistance (parasitic devices) of output signal lines respectively. Reference numerals 20 and 21 denote the parasitic capacitance (parasitic devices) of signal lines respectively. Reference numeral 22 denotes the gate capacitance of the next step computed by means of the formula (1) described above. Reference letters N1 through N3 denote signal lines. FIG. 9 is a diagram showing the equivalent circuit of the circuit shown in FIG. 8. In the figure, reference numeral 23 denotes a synthesized resistance of the resistance connected in series. Reference numeral 24 denotes the synthesized capacitance of the parasitic capacitance and the gate capacitance connected between the output signal line and the ground. Although the signal lines N1, N2 and N3 exist independently in FIG. 8, the signal lines N1 through N3 are not shown in FIG. 9 because the devices are merged. The processing is for the convenience of the computation of the time constant; the connection information of the signal lines N1 through N3 are held as it is during this processing.

After executing the processing described above, the time constant τ is computed by means of the following formula (6).

$$\tau = R \cdot C \tag{6}$$

where R denotes the total resistance value of the series resistance; C denotes the total capacitance value of the parallel capacitance.

Figure 10:
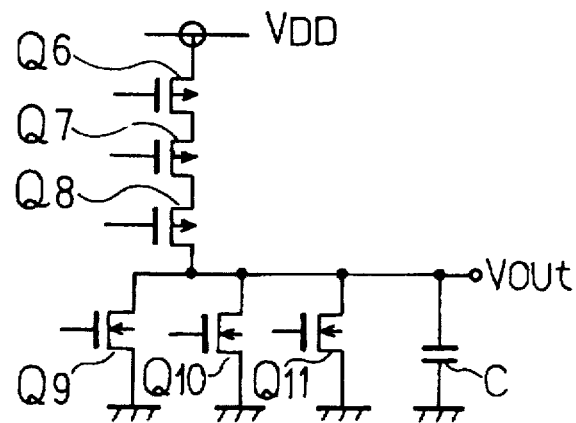
FIG. 10 is a circuit diagram showing a three-input OR gate.

Next, an example of obtaining a time constant in conformity with the above-mentioned computation processing about an actual CMOS logic circuit will be described. FIG. 10 is a circuit diagram showing a three-input NOR gate. As shown in the figure, the three-input NOR gate comprises three P-channel transistors (active devices) Q6 through Q8 connected in series and three N-channel transistors (active devices) Q9 through Q11 connected in parallel to each other. As paths which should be considered in the gate circuit, there are a path 1 from the $V_{DD}$ terminal to the output terminal through the P-channel transistors Q6 through Q8, a path 2 from the ground to the output terminal through the N-channel transistor Q9, a path 3 from the ground to the output terminal through the N-channel transistor Q10, and a path 4 from the ground to the output terminal through the N-channel transistor Q11.

At first, it is considered to obtain a time constant about the path 1 passing through the P-channel transistors Q6 through Q8. The resistance values of the transistors Q6 through Q8 are supposed to be R6 through R8 respectively. As is apparent from the above-mentioned formulae (2) through (4), the current Ids between the drain and the source of each transistor is generally expressed by the following formula when the channel width of each transistor is denoted by W, the channel length by L, and $Kp=(\epsilon_{ox} \cdot \mu)/Tox$.

$$Ids = (Kp/2) \cdot (W/L) \cdot (Vgs-Vth)^2 \tag{7}$$

where Vgs denotes the voltage between the gate and the source of the transistor, Vth denotes the threshold voltage of the transistor and is generally set as a constant.

The sum R of the ON-resistance of the three transistors connected in series is expressed as follows:

$$R = R6+R7+R8 \tag{8}$$

Accordingly, the time constant τ of the path 1 is obtained as follows:

$$\tau = R \cdot C = \frac{V_{ds} \cdot C}{\frac{Kp}{2}(V_{gs}-V_{th})^2} \cdot \left( \frac{L1}{W1} + \frac{L2}{W2} + \frac{L3}{W3} \right) \tag{9}$$

The power supply voltage $V_{DD}$ is inputted to Vds.

Besides, W1 through W3 denote the channel widths of the transistors Q6 through Q8 respectively; L1 through L3 denote the channel lengths of the transistors respectively.

For the path 1, the time constant τ is obtained by synthesizing the resistance components of the transistors connected in series. That is to say, the time constant is obtained about the case where the plurality of transistors are regarded as a collective body, which is connected to the next step through a signal line (Vout in FIG. 10). Because the time constant is concerned with a path passing through the P-channel transistors, "H" is displayed in the signal line logic displaying region 26 shown in FIG. 3.

As for the path 2, the time constant τ2 is expressed by the following formula, supposing that the channel width of the transistor Q9 is denoted by W4, and the channel length of the transistor is denoted by L4.

$$\tau 2 = \frac{V_{ds} \cdot C}{\frac{Kp}{2}(V_{gs}-V_{th})^2} \cdot \left( \frac{L4}{W4} \right) \tag{10}$$

A power supply voltage value $V_{DD}$ is inputted into the Vds as a default value in spite of the capability of changing it by a user.

Moreover, the paths 3 and 4 can be obtained like the path 2. Because the paths 2 through 4 are paths passing through the N-channel transistors, "L"s are displayed in the signal line logic displaying region 26 shown in FIG. 3.

Figure 11:
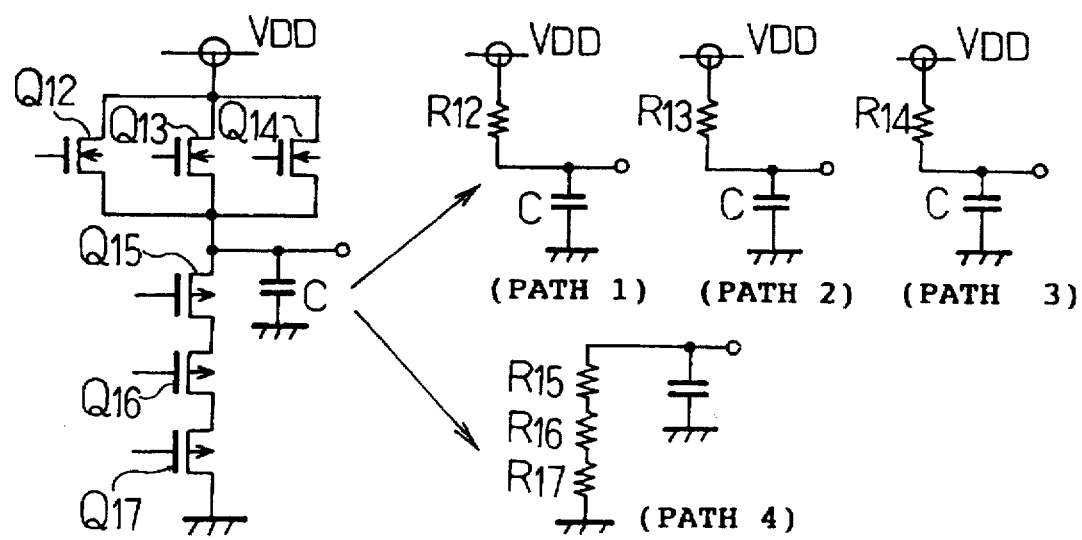
FIG. 11 is a diagram showing a three-input AND gate and respective paths.

FIG. 11 is a diagram showing a three-input AND gate and respective paths 1 through 4. In the figure, reference letters Q12 through Q17 denote a transistor (active device) respectively. Reference letters R12 through R17 denote the ON-resistance of the transistors Q12 through Q17 respectively. In this case, there are four paths, namely, path 1 from the $V_{DD}$ terminal to the output terminal through the transistor Q12, path 2 from the $V_{DD}$ terminal to the output terminal through the transistor Q13, path 3 from the $V_{DD}$ terminal to the output terminal through the transistor Q14, and path 4 from the ground to the output terminal through the transistors Q15 through Q17. The computation of a time constant corresponding to each path is executed similarly in the case of the three-input NOR gate shown in FIG. 10.

Figure 12:
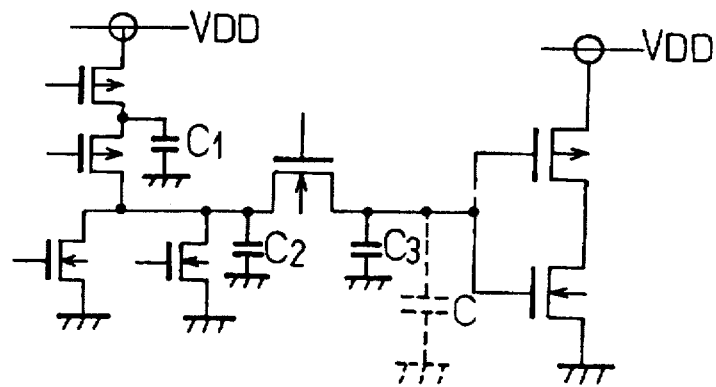
FIG. 12 is a diagram showing a concrete example for computing the parasitic capacitance on each signal line.

FIG. 12 is a diagram showing a concrete example for computing the parasitic capacitance on each signal line. As shown in the figure, the time constant of this circuit in which parasitic capacitance (parasitic device) C1 through C3 appears on each signal line is computed as if the synthesized parasitic capacitance C is connected between the signal line and the ground as shown by the dotted line in the figure.

As described above, according to the first embodiment, the semiconductor circuit design verifying apparatus, which takes in the circuit connection information and the parasitic device information (back annotation information), the logic circuit drawing information and the layout-plotted drawing information, respectively, computes the synthesized impedance of every path of a CMOS transistor circuit composed of a combination of transistors constituting a CMOS logic gate. The transistors may be connected in series or parallel to each other, or a combination of a compound logic gate and other circuit elements connected in series or parallel to each other. And then, the time constant when the voltage varies can be obtained. Furthermore, the obtained time constant is compared with the reference time constant set by a user, and the time constant which exceeds the reference time constant is held as the time constant information together with the connection information of a driving transistor. The held time constant information is displayed, or outputted as a data having a prescribed format.

Hence, a user can verify a designed circuit based on the time constant information. As compared with the conventional circuit simulation which requires dynamic analysis, the present computation of the time constant is static analysis by which the amount of computation can be suppressed to be small, and it can consequently be enabled to execute the verification of the whole of a large scale designed circuit in a short time, such verification was difficult by using traditional means because the amount of computation was enormous.

Furthermore, the first embodiment computes the synthesized impedance of every path in the case where there exists the combination of a plurality of transistors connected in series or parallel to each other, or the combination of compound logic gates and other circuit elements connected in series or parallel to each other, and the first embodiment computes the parasitic capacitance at a plurality of places as the parasitic capacitance at a single place by synthesizing the capacitance at the plurality of places. Thereby, a plurality of devices is assembled so that the time constant of the assembly is computed, and hence the amount of computation can be small. Consequently, higher speed verification for a larger scale circuit can be executed. Moreover, the time constant obtained by the computation is compared with the reference time constant set by a user, and the time constant information not exceeding the value of the reference time constant is neglected. Thereby, the amount of the computation which does not influence the verification of a circuit is decreased for enabling the higher speed output of a verification result.

Generally, there are some cases where a result having about a hundred thousand items is outputted from the verification apparatus if all of the results of the verification is outputted, even though it depends on the circuit scale of a chip. Hence, suppressing the outputting of the time constant information not required for verification is important for the aspect of specifying a part of a designed circuit that is not working properly as well as the aspect of speed enhancement. Accordingly, the efficiency of the verification of the apparatus is improved.

SECOND EMBODIMENT

The basic structure and the operation of the second embodiment are the same as those shown in FIG. 1 and 2 respectively, and the following operation is added to the operation of the circuit connection information holding part 5 and the time constant computing part 8 of the embodiment 1 in the present embodiment 2. That is to say, the drain current of a transistor is given by one formula shown in the following in the embodiment 1.

$$I_{ds} = (Kp/2) \cdot (W/L) \cdot (V_{gs} - V_{th})^2 \quad (11)$$

This formula is one expressing the current when a transistor operates in the saturated state. When a transistor operates in the non-saturated state, the drain current is given by the following formula.

$$I_{ds} = Kp \cdot (W/L) \cdot ((V_{gs} - V_{th}) \cdot V_{ds} - 1/2 \cdot V_{ds}^2) \quad (12)$$

Accordingly, the time constant τ is computed as follows in the case where the three transistors Q6 through Q8 are connected in series, because the synthesized value R of the ON-resistance of the transistors Q6 through Q8 is R=R6+R7+R8 in this case.

$$\tau = R \cdot C = \dfrac{V_{ds} \cdot C}{Kp \left( (V_{gs} - V_{th}) \cdot V_{ds} - \dfrac{1}{2} V_{ds}^2 \right)} \cdot \left( \dfrac{L1}{W1} + \dfrac{L1}{W2} + \dfrac{L3}{W3} \right) \quad (13)$$

where $Kp = (\epsilon_{ox} \cdot \mu)/T_{ox}$.

A user adds the transistor operation state information (active device operation state information) to the logic circuit drawing information for distinguishing the operation of a transistor between operation in the saturated state and the non-saturated state. The transistor operation state information may be designated to every CMOS logic gate or every transistor, or further to every function block of the designed circuit. The transistor operation state information is extracted at the circuit connection information extracting part 3 to be held in the circuit connection information holding part 5 together with circuit connection information. The time constant computing part 8 selects an appropriate formula for computing the drain current of the transistor out of the formulae (9) and (13) for the extracted transistor operation state information to execute the computation of the time constant. As for the subsequent operation, the time constant is compared similarly in the embodiment 1 to be outputted.

As described above, in the second embodiment, the drain current suitable for the operation state of a transistor is computed in accordance with the circuit operation state designated to every CMOS logic gate, every transistor or every function block of the circuit that is an object of the verification, and the time constant is computed for this drain current. Consequently, it is possible to execute the more precise verification in accordance with the operation of the transistor.

THIRD EMBODIMENT

Although the semiconductor circuit design verifying apparatus of the third embodiment is same basic structure and the operation as that of the above-mentioned first embodiment, the following points are different from those of the embodiment 1. That is, in the first embodiment, output data are outputted in the form of the time constant information list shown in FIG. 3. But, in the third embodiment, the output data generating part 14 outputs the data in the form readable by a circuit drawing apparatus. By employing the format with which the circuit drawing apparatus can directly read the outputted data, design changes may be performed rapidly if they are demanded. Furthermore, it may be employable feasible that the signal line corresponding to the time constant information outputted from the output data generating part 14 would be displayed or outputted in a distinct form from the other signal lines, e.g., in color or in different kinds of wires on the logic circuit drawing.

Figure 13:
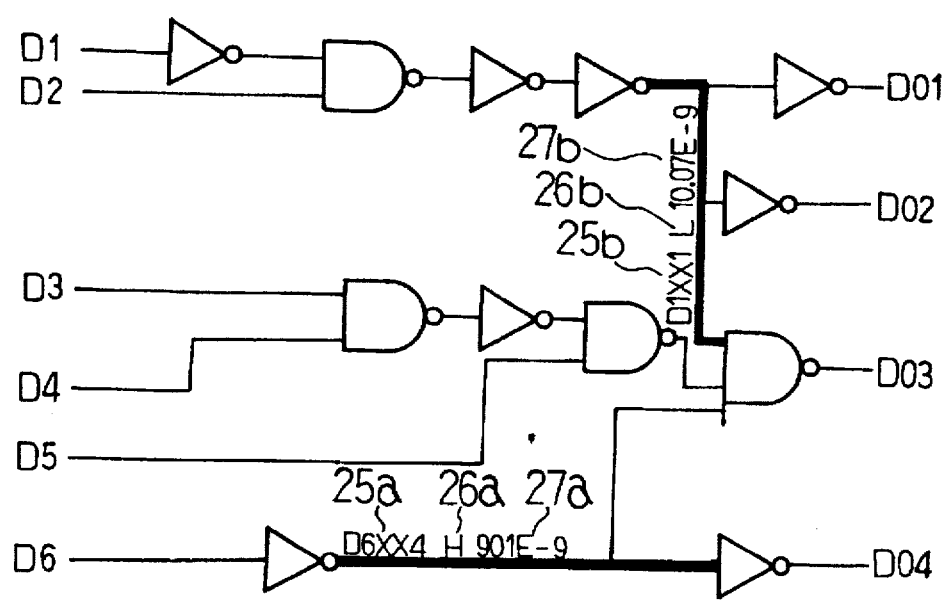
FIG. 13 is a diagram showing the example of an outputted result of the verification of a third embodiment (embodiment 3) of the present invention.

FIG. 13 shows the example of an outputted result of the embodiment 3. In the figure, reference numerals 25a and 25b denote signal line name displaying regions. Reference numerals 26a and 26b denote signal line logic indicating regions indicating whether the transistor at the time of computing the time constant is an N-channel transistor or a P-channel transistor. Reference numerals 27a and 27b denote signal line time constant indicating regions indicating the time constants of the signal lines. As shown in the figure, corresponding signal lines are highlighted with heavy lines.

As described above, the third embodiment displays time constant information in a state corresponding to signal lines on the logic circuit drawing when it displays or outputs the time constant information. Thereby, a user can grasp verification results exactly in connection with circuit drawings.

FOURTH EMBODIMENT

Although the fourth embodiment is same in basic structure and operation as that of the above-mentioned first embodiment, the following points are different from those of the first embodiment. That is, in the first embodiment, output data are outputted in the form of the time constant information list shown in FIG. 3. But, in the fourth embodiment, the output data generating part 14 outputs the data in a form readable by a layout-plotted drawing making apparatus. By employing the format with which the layout-plotted drawing apparatus can directly read the outputted data, layout changes of a circuit may be performed rapidly if they are demanded. Furthermore, it may be feasible that the signal line corresponding to the time constant information outputted from the output data generating part 14 would be displayed or outputted in a distinct form from the other signal lines, e.g., in color or in different kinds of wires on the layout-plotted drawing.

Figure 14:
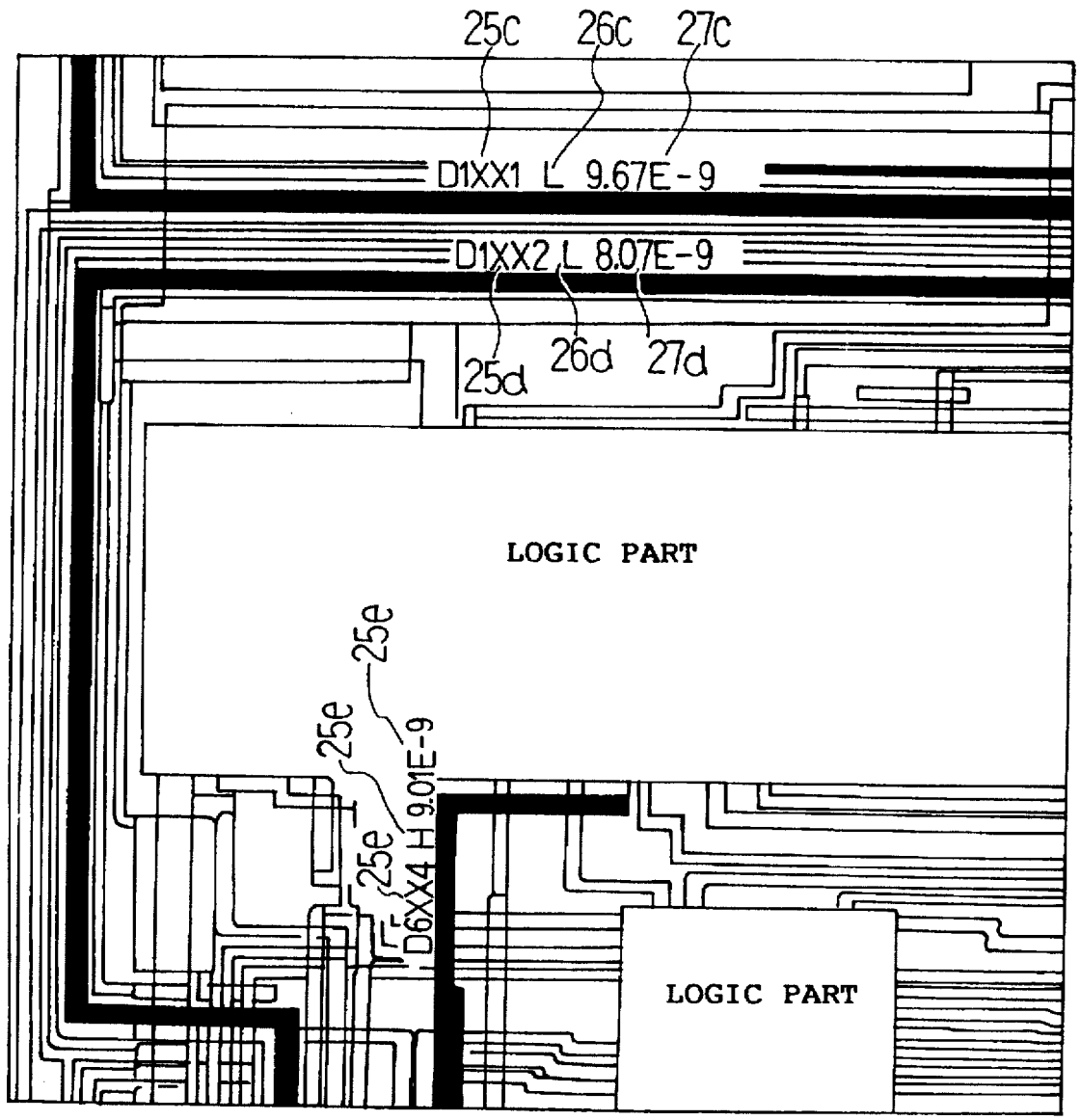
FIG. 14 is a diagram showing the example of a result of the verification of a fourth embodiment (embodiment 4) of the present invention.

FIG. 14 shows an example of an outputted result of the embodiment 4. In the figure, reference numerals 25c through 25e denote signal line name displaying regions. Reference numerals 26c through 26e denote signal line logic indicating regions indicating whether the transistor at the time of computing the time constant is an N-channel transistor or a P-channel transistor. Reference numerals 27c through 27e denote signal line time constant indicating regions indicating the time constants of the signal lines.

As described above, the fourth embodiment displays time constant information in a state corresponding to signal lines on the layout-plotted drawing when it displays or outputs the time constant information. Thereby, a user can grasp verification results exactly in connection with the layout-plotted drawings.

FIFTH EMBODIMENT

Although the embodiment 5 is same in basic structure and operation as that of the above-mentioned first embodiment, the parasitic device retrieving part 7 and the time constant computing part 8 are different from those of the first embodiment.

The parasitic device retrieving part 7 of the embodiment 5 retrieves only the parasitic devices existing on a path up to a bus line if the searching for the retrieval thereof reaches the bus line before reaching the input terminal of a CMOS logic gate or the gate terminal of a transistor.

Figure 15:
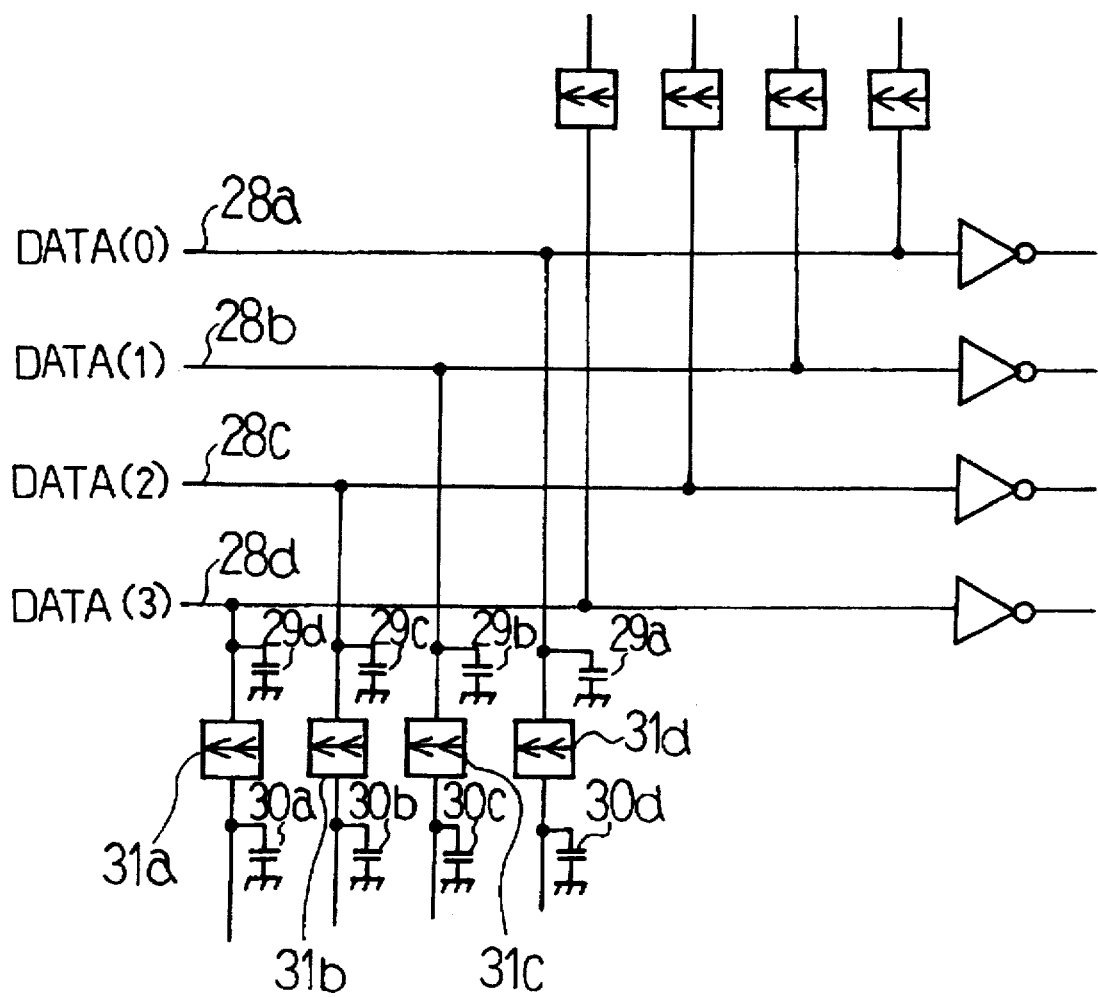
FIG. 15 is a diagram showing a circuit including bus lines designed according to a fifth embodiment (embodiment 5) of the present invention.
Figure 16:
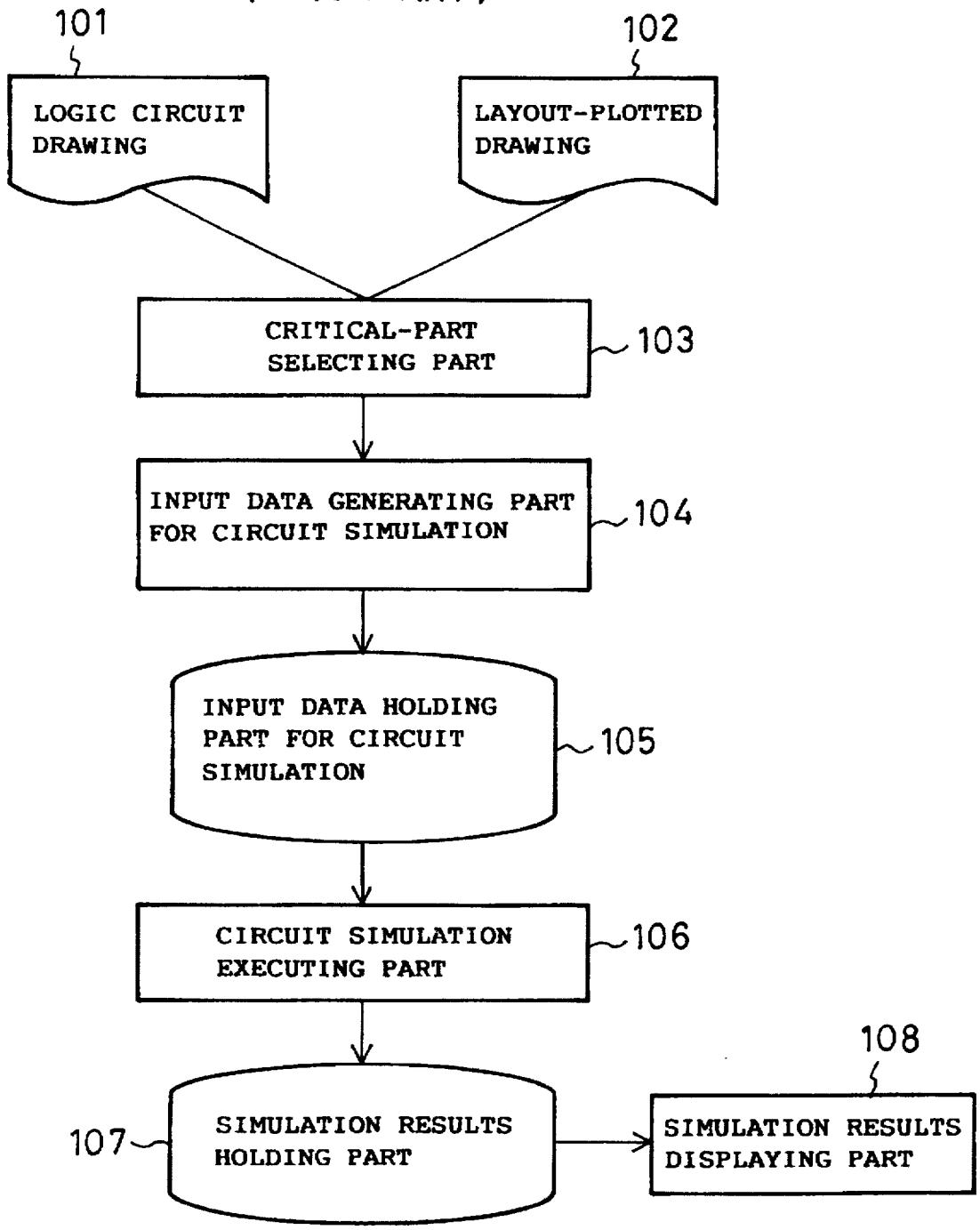
FIG. 16 is a block diagram showing a conventional semiconductor circuit design verifying apparatus.

FIG. 15 shows a circuit including bus lines. In the figure, reference numerals 28a through 28d denote bus lines. Reference numerals 29a through 29d denote parasitic capacitance devices parasitic on the bus lines 28a through 28d respectively. Reference numerals 30a through 30d denote parasitic capacitance devices parasitic on the signal lines up to the bus lines 28a through 28d, respectively. Reference numeral 31a through 31d denote transmission gates. In the analysis of the circuit including the bus lines 28a through 28d, the searching paths for retrieving parasitic devices are assumed to be up to the bus lines 28a through 28d. But, since it is necessary to consider the parasitic devices on the bus lines themselves, the computation of the time constant is executed in the condition that the parasitic capacitance devices 29a through 29d are added to the parasitic devices 30a through 30d up to the bus lines 29a through 29d.

The reason why the computation of the time constant is executed for a plurality of regions divided by the bus lines is that a transfer gate, a transmission gate and the like is normally connected to a bus line, and that those gates turn on or off under the control of a CPU or the like as time passes. That is, since the verification of the fan out of a designed circuit according to the computation of a time constant of the present invention is a static analysis, it is not suitable for the verification of the part where the connection state varies as time goes on. Accordingly, the present fifth embodiment divides a path into a part up to a bus line and a part after the bus line to execute the computation of a time constant at each part separately.

As described above, according to the fifth embodiment, it is possible to execute the verification of the whole circuit without increasing the amount of computation even in case of verifying the fan out of the design of a circuit including bus lines.

SIXTH EMBODIMENT

In the sixth embodiment, the fan out verification is executed only for one or a plurality of signal lines which are designated by a user in each of the aforementioned first through fifth embodiment.

That is, the parasitic device retrieving part 7 executes the retrieval of a parasitic device only for one or a plurality of designated signal lines for the computation of a time constant by the time constant computing part 8. The structure by which the results of the computation of obtained time constants are outputted in a form shown in respective embodiments described above may be taken. And thereby, waste computation time can be saved, and verification can be executed at higher speed.

SEVENTH EMBODIMENT

In the seventh embodiment, the fan out verification is executed only for a part where design was changed when a designed circuit was verified to change the design thereof.

That is, if the design was changed, the design change information indicating the fact that the design was changed is added to the logic circuit drawing information 1 or the layout-plotted information 2. When the verification is executed at the next time, the embodiment refers to the design change information, and the parasitic device retrieving part 7 executes the retrieval of a parasitic device only for the part where the design was changed for the computation of the time constant of the part by the time constant computing part 8. Since a part requiring verification is automatically specified for executing the computation of a time constant by taking such structure as this, verification can be executed rapidly.

The above-mentioned first through seventh embodiments may be organized by means of software on a general purpose computer, or may wholly be constructed by hardware.

As described above, according to the first aspect of the present invention, the time constant computing means thereof is composed so as to compute a time constant between each active device and a next step active device among the plurality of active devices inclusively of the parasitic device parasitic on the signal line connecting the active devices and retrieved by the parasitic device retrieving means, and the time constant information outputting means thereof is composed so as to output the information concerned with the computed time constant in connection with at least a part of the design information of the semiconductor circuit. Consequently, the amount of the computation required for the verification of a designed circuit can be suppressed to be small, and there can be obtained the advantage that it becomes possible to execute the verification for the whole of a large scale designed circuit in short time.

Furthermore, according to the second aspect of the present invention, the time constant computing means is composed so as to compute a time constant by replacing the resistance components and the capacitance components of each active device and the next step active device and a parasitic device with a combination of one synthesized resistance and one synthesized capacitance. Consequently, there can be obtained the advantage that the amount of the computation of a time constant can be decreased for enabling the further shortening of time required for the verification of a designed circuit.

Furthermore, according to the third aspect of the present invention, the time constant information outputting means is composed so as to output the information concerning a time constant having a value larger than the reference time constant on a result of the comparison by the comparing means. Consequently, there is obtained the advantage that the verification of design can be executed rapidly because the information concerned with a time constant necessary for the verification of design is restrictedly outputted.

Furthermore, according to the fourth aspect of the present invention, the time constant computing means is composed so as to select a computation formula fitting to the operation state of an active device out of a plurality of computing formulae on the information indicating the operation state of the active device, and to compute a time constant in conformity with the selected computation formula. Consequently, there is obtained the advantage that it becomes possible to execute the more precise verification of design reckoning with active devices.

Furthermore, according to the fifth aspect of the present invention, the time constant computing means is composed so as to compute a time constant of a path including a signal line selected by a user out of the inputted design information of a semiconductor circuit, and to send the computed time constant to the time constant information outputting means. Accordingly, the user can specify the part necessary to be verified in a designed circuit. By executing the verification of the design at the specified part, there is obtained the advantage that the computing time required for verification can further be shortened.

Furthermore, according to the sixth aspect of the present invention, the time constant computing means is composed so as to execute the computation of a time constant for the part where the design of a semiconductor circuit was changed if the inputted design information of the semiconductor circuit was updated owing to the change of design. Consequently, there is obtained the advantage that a part whose design is necessary to be verified is automatically specified and thereby the verification thereof can be executed rapidly.

Furthermore, according to the seventh aspect of the present invention, the time constant computing means is composed so as to divide a semiconductor circuit into a region up to a bus line and a region after the bus line to execute the computation of a time constant in each region independently if the semiconductor circuit includes the bus line. Consequently, the verification of a designed circuit can be executed only by means of the static analysis of the circuit even if it has bus lines, and thereby the amount of computation for the verification of the designed circuit can be decreased. Hence, there is obtained the advantage that the verification of the design of a circuit can be executed in a short time even if the circuit includes a bus line.

Furthermore, according to the eighth aspect of the present invention, the time constant information outputting means is composed so as to output the information concerned with time constants computed by the time constant computing means in order of largeness of the values of the time constants. Consequently, the information important in the verification of design is preferentially outputted, and thereby there is obtained the advantage that the verification of a wrongly designed part can be executed rapidly.

Furthermore, according to the ninth aspect of the present invention, the time constant information outputting means is composed so as to output the information concerned with a time constant computed by the time constant computing means with correspondence to a signal line in a logic circuit diagram of a semiconductor circuit. Consequently, the results of verification can more clearly be grasped on the logical circuit drawing.

Furthermore, according to the tenth aspect of the present invention, the time constant information outputting means is composed so as to output the information concerned with a time constant computed by the time constant computing means with correspondence to a signal line in a layout-plotted drawing of a semiconductor circuit. Consequently, the results of verification can more clearly be grasped on the layout-plotted drawing.

While preferred embodiments of the present invention have been described using specific terms, such description is for illustrative purposes only, and it is to be understood that changes and variations may be made without departing from the spirit or scope of the following claims.

What is claimed is:

1. A semiconductor circuit design verifying apparatus comprising:

design information inputting means for inputting design information of a semiconductor circuit, the semiconductor circuit including a plurality of active devices and a plurality of signal lines;

parasitic device retrieving means for retrieving a parasitic device for a signal line, the signal line connecting a plurality of first stage active devices to a next stage active device driven by the first stage active devices, based on the design information input by said design information inputting means, each active device and the parasitic device including a resistance component and a capacitance component;

time constant computing means for computing a time constant between each first stage active device and the next stage active device driven by each first stage active device, among the plurality of active devices, each time constant being calculated from the resistance and capacitance components of each first stage active device, the next stage active device, and the parasitic device for the signal line connecting the first stage active devices and the next stage active device retrieved by the parasitic device retrieving means; and time constant information outputting means for displaying each time constant and information associated with each time constant computed by the time constant computing means in connection with at least a part of the design information of the semiconductor circuit.

2. The semiconductor circuit design verifying apparatus according to claim 1, wherein the time constant computing means computes each time constant by replacing the resistance components and the capacitance components of each first stage active device, the next stage active device, and the parasitic device with a combination of one synthesized resistance and one synthesized capacitance.

3. The semiconductor circuit design verifying apparatus according to claim 1, wherein the time constant information outputting means displays each time constant and information concerning each time constant computed by the time constant computing means corresponding to a signal line in a layout-plotted drawing of a semiconductor circuit.

4. The semiconductor circuit design verifying apparatus according to claim 1, wherein the design information includes active device operation state information indicating an operation state of each first stage active device, and the time constant computing means selects at least one of a first computation formula for a first operation state of each first stage active device and a second computation formula for a second operation state of each first stage active device and wherein the time constant computing means computes a time constant in conformity with the selected computation formula.

5. The semiconductor circuit design verifying apparatus according to claim 1, wherein the time constant computing means computes a time constant of a path including a signal line selected by a user from the input design information of a semiconductor circuit, and sends the computed time constant to the time constant information outputting means.

6. The semiconductor circuit design verifying apparatus according to claim 1, wherein the time constant computing means computes a time constant for a portion of the semiconductor circuit where a design of the semiconductor circuit was changed if input design information of the semiconductor circuit was updated due to a change of design.

7. The semiconductor circuit design verifying apparatus according to claim 1, wherein the semiconductor circuit includes a bus line and wherein the time constant computing means divides a semiconductor circuit into a first region from each first stage active device up to the bus line and a second region from the bus line to the next stage active device and computes a time constant for the first and second regions independently.

8. The semiconductor circuit design verifying apparatus according to claim 1, wherein the time constant information outputting means displays the time constants computed by the time constant computing means and information associated with the time constants in descending order according to values of the time constants.

9. The semiconductor circuit design verifying apparatus according to claim 1, wherein the time constant information outputting means displays each time constant and information associated with each time constant computed by the time constant computing means corresponding to a signal line in a logic circuit diagram of the semiconductor circuit.

10. The semiconductor circuit design verifying apparatus according to claim 1, further comprising storing means for storing a reference time constant, and comparing means for comparing each time constant computed by said time constant computing means with the reference time constant stored in the storing means, and wherein the time constant information outputting means displays time constants computed by the time constant computing means having a value larger than the reference time constant in response to a comparison by the comparing means.

11. The semiconductor design verifying apparatus of claim 10 wherein the first operation state comprises a saturated state and the second operation state comprises a non-saturated state.

* * * * *